(12) United States Patent
Falster et al.

(10) Patent No.: US 8,026,145 B2
(45) Date of Patent: Sep. 27, 2011

(54) ARSENIC AND PHOSPHORUS DOPED SILICON WAFER SUBSTRATES HAVING INTRINSIC GETTERING

(75) Inventors: Robert J. Falster, London (GB); Vladimir Voronkov, Merano (IT); Gabriella Borionetti, Novara (IT)

(73) Assignee: MEMC Electronic Materials, Inc., St. Peters, MO (US)

( * ) Notice: Subject to any disclaimer, the term of this patent is extended or adjusted under 35 U.S.C. 154(b) by 373 days.

(21) Appl. No.: 12/347,336

(22) Filed: Dec. 31, 2008

(65) Prior Publication Data

US 2009/0130824 A1    May 21, 2009

Related U.S. Application Data

(62) Division of application No. 11/270,790, filed on Nov. 9, 2005, now Pat. No. 7,485,928.

(51) Int. Cl.
*H01L 21/331* (2006.01)
*H01L 21/8222* (2006.01)

(52) U.S. Cl. ........ 438/311; 438/509; 438/513; 438/663; 257/E21.063; 257/E21.32; 257/E21.321; 257/E21.435

(58) Field of Classification Search ............ 438/311, 438/505, 508, 509, 513, 514, 474, 475, 662, 438/663; 257/E21.043, 32, 321, 435, 275
See application file for complete search history.

(56) References Cited

U.S. PATENT DOCUMENTS

| | | |
|---|---|---|
| 4,314,595 A | 2/1982 | Yamamoto et al. |
| 4,376,657 A | 3/1983 | Nagasawa et al. |
| 4,437,922 A | 3/1984 | Bischoff et al. |
| 4,505,759 A | 3/1985 | O'Mara |
| 4,548,654 A | 10/1985 | Tobin |
| 4,666,532 A | 5/1987 | Korb et al. |
| 4,851,358 A | 7/1989 | Huber |
| 4,868,133 A | 9/1989 | Huber |
| 5,327,007 A | 7/1994 | Imura et al. |
| 5,401,669 A | 3/1995 | Falster et al. |
| 5,403,406 A | 4/1995 | Falster et al. |
| 5,445,975 A | 8/1995 | Gardner et al. |
| 5,502,010 A | 3/1996 | Nadahara et al. |
| 5,502,331 A | 3/1996 | Inoue et al. |
| 5,593,494 A | 1/1997 | Falster |
| 5,611,855 A | 3/1997 | Wijaranakula |
| 5,674,756 A | 10/1997 | Satoh et al. |
| 5,788,763 A | 8/1998 | Hayashi et al. |
| 5,929,482 A | 7/1999 | Kawakami et al. |

(Continued)

FOREIGN PATENT DOCUMENTS

EP    0503816 B1    9/1992

(Continued)

OTHER PUBLICATIONS

Abe et al., "Defect-Free Surfaces of Bulk Wafers by Combination of RTA and Crystal Growth Conditions," 31st Symposium on ULSI Ultra Clean Technology, pp. 23-31, Tokyo Japan, Dec. 18 to Dec. 19, 1997.

(Continued)

*Primary Examiner* — David Nhu
(74) *Attorney, Agent, or Firm* — Armstrong Teasdale LLP

(57) ABSTRACT

A process for the preparation of low resistivity arsenic or phosphorous doped (N+/N++) silicon wafers which, during the heat treatment cycles of essentially any arbitrary electronic device manufacturing process, reliably form oxygen precipitates.

18 Claims, 1 Drawing Sheet

U.S. PATENT DOCUMENTS

| | | | |
|---|---|---|---|
| 5,939,770 A | 8/1999 | Kageyama | |
| 5,944,889 A | 8/1999 | Park et al. | |
| 5,994,761 A | 11/1999 | Falster et al. | |
| 6,150,708 A | 11/2000 | Gardner et al. | |
| 6,171,389 B1 | 1/2001 | Anderson | |
| 6,180,220 B1 | 1/2001 | Falster et al. | |
| 6,190,631 B1 | 2/2001 | Falster et al. | |
| 6,191,010 B1 | 2/2001 | Falster | |
| 6,204,152 B1 | 3/2001 | Falster et al. | |
| 6,236,104 B1 | 5/2001 | Falster | |
| 6,284,384 B1 | 9/2001 | Wilson et al. | |
| 6,306,733 B1 | 10/2001 | Falster et al. | |
| 6,336,968 B1 | 1/2002 | Falster | |
| 6,339,016 B1 | 1/2002 | Torack et al. | |
| 6,350,315 B2 | 2/2002 | Anderson | |
| 6,361,619 B1 | 3/2002 | Falster et al. | |
| 6,432,197 B2 | 8/2002 | Falster | |
| 6,485,807 B1 | 11/2002 | Park | |
| 6,491,752 B1 | 12/2002 | Kirscht et al. | |
| 6,503,594 B2 | 1/2003 | Park | |
| 6,537,368 B2 | 3/2003 | Falster et al. | |
| 6,537,655 B2 | 3/2003 | Wilson et al. | |
| 6,544,656 B1 | 4/2003 | Abe et al. | |
| 6,579,779 B1 | 6/2003 | Falster | |
| 6,586,068 B1 | 7/2003 | Falster et al. | |
| 6,596,095 B2 | 7/2003 | Ries et al. | |
| 6,666,915 B2 | 12/2003 | Yang et al. | |
| 6,686,260 B2 | 2/2004 | Falster et al. | |
| 6,720,627 B1 | 4/2004 | Iwata et al. | |
| 6,743,495 B2 | 6/2004 | Vasat et al. | |
| 6,774,454 B2 | 8/2004 | Hirabayashi | |
| 6,780,238 B2 | 8/2004 | Park | |
| 6,801,307 B2 | 10/2004 | Ziegler et al. | |
| 6,821,344 B2 | 11/2004 | Park | |
| 6,897,084 B2 * | 5/2005 | Binns et al. | 438/58 |
| 6,946,711 B2 | 9/2005 | Suzuki et al. | |
| 6,958,092 B2 | 10/2005 | Wilson et al. | |
| 7,845,928 B2 * | 12/2010 | Finkowski et al. | 425/299 |
| 2002/0078882 A1 | 6/2002 | Torack et al. | |
| 2002/0164843 A1 | 11/2002 | Yamazaki et al. | |
| 2002/0170631 A1 | 11/2002 | Falster et al. | |
| 2002/0179006 A1 | 12/2002 | Borgini et al. | |
| 2003/0008480 A1 | 1/2003 | Takeno et al. | |
| 2003/0104222 A1 | 6/2003 | Ono et al. | |
| 2005/0032337 A1 | 2/2005 | Wilson et al. | |
| 2005/0045962 A1 | 3/2005 | Iwata et al. | |
| 2005/0158969 A1 | 7/2005 | Binns et al. | |
| 2006/0138601 A1 | 6/2006 | Seacrist et al. | |

FOREIGN PATENT DOCUMENTS

| | | |
|---|---|---|
| EP | 0536958 A1 | 4/1993 |
| EP | 0942078 A1 | 9/1999 |
| EP | 1087041 A1 | 3/2001 |
| EP | 1202334 A1 | 5/2005 |
| JP | 02032535 | 2/1990 |
| JP | 7321120 A | 12/1995 |
| JP | 7335657 A | 12/1995 |
| JP | 8045944 A | 2/1996 |
| JP | 8203913 | 8/1996 |
| JP | 8045945 A | 10/1997 |
| JP | 9283529 | 10/1997 |
| JP | 11067781 A | 3/1999 |
| JP | 11150119 A | 6/1999 |
| JP | 2005089246 A | 4/2005 |
| JP | 2005150364 A | 6/2005 |
| WO | 9845507 A1 | 10/1998 |
| WO | 0008677 A1 | 2/2000 |
| WO | 0034999 A2 | 6/2000 |
| WO | 0077830 A3 | 12/2000 |
| WO | 03088346 A1 | 10/2003 |

OTHER PUBLICATIONS

Abe et al., "High Resistivity CZ Silicon for RF Applications Substituting GaAs," Electrochemical Society Proceedings, vol. 2000-17, pp. 491-500 (2000).

Abe et al., "Innovated Silicon Crystal Growth and Wafering Technologies," Electrochemical Society Proceedings, vol. 97-3, pp. 123-133 (1997).

Cheung, "Plasma Immersion Ion Implantation for Semiconductor Processing," Materials Chemistry and Physics, vol. 46, No. 2-3, pp. 132-139 (1996).

Chiou, "The Effects of Preheatings on Axial Oxygen Precipitation Uniformity in Czochralski Silicon Crystals" Journal of the Electrochemical Society, vol. 139, No. 6, pp. 1680-1684 (1992).

Claybourn et al., "Thermal Donor Formation and the Loss of Oxygen from Solution in Silicon Heated at 450° C," Applied Physics Letters, vol. 52, No. 25, pp. 2139-2141 (1988).

Falster et al., "The Engineering of Silicon Wafer Material Properties Through Vacancy Concentration Profile Control and the Achievement of Ideal Oxygen Precipitation Behavior," Materials Research Society Symposium Proceedings, vol. 510, pp. 27-35 (1998).

Hara et al., "Enhancement of Oxygen Precipitation in Quenched Czochralski Silicon Crystals," Journal of Applied Physics, vol. 66, No. 8, pp. 3958-3960 (1989).

Isomae et al., "Depth Profiles of Interstitial Oxygen Concentrations in Silicon Subjected to Three-Step Annealing," Journal of Applied Physics, vol. 55, No. 4, pp. 817-824, (1984).

Jacob et al., "Determination of Vacancy Concentrations in the Bulk of Silicon Wafers by Platinum Diffusion Experiments" Journal of Applied Physics, vol. 82, No. 1, pp. 182-191 (1997).

Jacob et al., "Influence of RTP on Vacancy Concentrations," Materials Research Society Symposium Proceedings, vol. 490, pp. 129-134 (1998).

Kaiser et al., "Electrical and Optical Properties of Heat-Treated Silicon," Physical Review, vol. 105, No. 6, pp. 1751-1756 (1957).

Kaiser et al., "Mechanism of the Formation of Donor States in Heat-Treated Silicon," Physical Review, vol. 112, No. 5, pp. 1546-1554 (1958).

Londos et al. "Effect of Oxygen Concentration on the Kinetics of Thermal Donor Formation in Silicon at Temperatures Between 350 and 500° C," Applied Physics Letters, vol. 62, No. 13, pp. 1525-1526 (1993).

Nadahara et al., "Hydrogen Annealed Silicon Wafer," Solid State Phenomena, vol. 57/58, pp. 19-26 (1997).

Pagani et al., "Spatial Variations in Oxygen Precipitation in Silicon After High Temperature Rapid Thermal Annealing," Applied Physics Letters, vol. 70, No. 12, pp. 1572-1574 (1997).

Shimura, "Semiconductor Silicon Crystal Technology," Academic Press, San Diego, CA, pp. 360-377 (1989).

Wijaranakula et al., "A Formation of Crystal Defects in Carbon-Doped Czochralski-Grown Silicon after Three-Step Internal Gettering Anneal," Journal of the Electrochemical Society, vol. 138, No. 7, pp. 2153-2159 (1991).

Winkler et al., "Improvement of the Gate Oxide Integrity by Modifying Crystal Pulling and its Impact on Device Failure," Journal of the Electrochemical Society, vol. 141, No. 5, pp. 1398-1401 (1994).

Zimmermann et al., "Gold and Platinum Diffusion: The Key to the Understanding of Intrinsic Point Defect Behavior in Silicon," Applied Physics A, vol. 55, No. 2, pp. 121-134 (1992).

Zimmermann et al., "Investiation of the Nucleation of Oxygen Precipitates in Czochralski Silicon at an Early Stage," Applied Physics Letters, vol. 60, No. 26, pp. 3250-3253 (1992).

Zimmermann et al., "The Modeling of Platinum Diffusion in Silicon Under Non-Equilibrium Conditions," Journal of the Electrochemical Society, vol. 139, No. 1, pp. 256-262 (1992).

Zimmermann et al., "Vacancy Concentration Wafer Mapping in Silicon," Journal of Crystal Growth, vol. 129, No. 3-4, pp. 582-592 (1993).

Abstract of JP2005150364, published Jun. 9, 2005, as supplied from esp@cenet database Worldwide on Jun. 22, 2007.

International Search Report issued in analogous application No. PCT/US2006/060651 on May 25, 2007.

Maddalon-Vinante, et al., "Charged Particle Activation Analysis Study of the Oxygen Outdiffusion from CZ Grown Silicon During Classical and Rapid Thermal Annealing in Various Gas Ambient" J Applied Physics, 74(10): 6115-6119 (1993).

Hawkins, et al., "The Effect of Rapid Thermal Annealing on the Precipitation of Oxygen in Silicon" J Applied Physics, 65(9): 3644-3654 (1989).

* cited by examiner

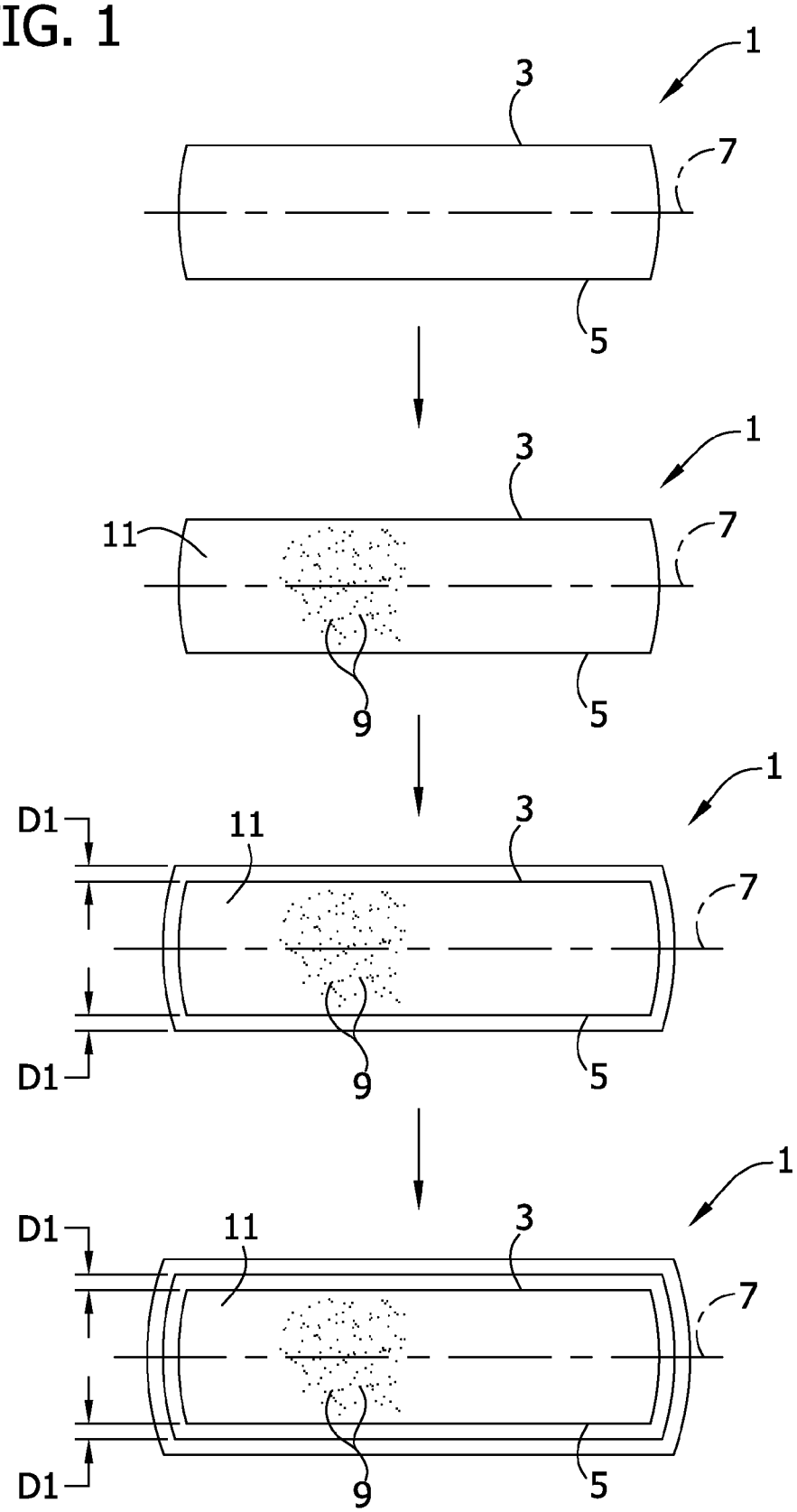

US 8,026,145 B2

ARSENIC AND PHOSPHORUS DOPED SILICON WAFER SUBSTRATES HAVING INTRINSIC GETTERING

REFERENCE TO RELATED APPLICATIONS

This application is a divisional of U.S. patent application Serial No. 11/270,790 filed Nov. 9, 2005, now U.S. Pat. No. 7,485,928.

THE FIELD OF THE INVENTION

The present invention generally relates to the preparation of silicon wafers used in the manufacture of electronic components. More particularly, the present invention relates to a process for the preparation of low resistivity arsenic or phosphorous doped (N+/N++) silicon wafers which, during the heat treatment cycles of essentially any arbitrary electronic device manufacturing process, reliably form oxygen precipitates.

BACKGROUND OF THE INVENTION

Single crystal silicon, which is the starting material for most processes for the fabrication of semiconductor electronic components, is commonly prepared with the so-called Czochralski (Cz) process wherein a single seed crystal is immersed into molten silicon and then grown by slow extraction. Molten silicon is contaminated with various impurities, among which is mainly oxygen, during the time it is contained in a quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in the solidified silicon. Such concentrations are greater than the solubility of oxygen in solid silicon at temperatures typical for the processes used to fabricate electronic devices. As the crystal grows from the molten mass and cools, therefore, the solubility of oxygen in it decreases rapidly, whereby in the wafers sliced from the crystal, oxygen is present in supersaturated concentrations.

Thermal treatment cycles typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Some applications, such as power devices including MOS-FETS, require heavily arsenic or phosphorous doped, low resistivity single crystal silicon wafers having intrinsic gettering. Such wafers have presented challenges. At the concentrations of arsenic and phosphorous required to achieve the desired resistivity of 5 mΩ-cm or less, the arsenic or phosphorous dopant tends to suppress oxygen precipitation below the threshold density desired for intrinsic gettering.

In U.S. Pat. No. 6,491,752, Kirscht et al. attempted to address this problem by doping the single crystal silicon with carbon during the crystal growth process. The amount of carbon varied from relatively light doping (~$4\times10^{16}$ atoms/$cm^3$) near the seed end of the single crystal silicon ingot to relatively heavy doping (~$2\times10^{17}$ atoms/$cm^3$) near the tail end of the single crystal silicon ingot; according to Kirscht et al., heavy carbon doping was required to yield wafers in which oxygen precipitates could form if the wafer was sliced from a location of any appreciable distance from the ingot seed cone. This approach, however, was not entirely satisfactory. For example, oxygen dependent intrinsic gettering was not observed for heavily doped wafers sliced from about the mid-point along the crystal axis to the end cone. See Kirscht et al.'s FIG. 4. Also, this approach requires carbon concentration to increase as a function of ingot length; resulting in a lack of wafer-to-wafer uniformity and more complex crystal growth process control.

SUMMARY OF THE INVENTION

Among the various aspects of the present invention, therefore, is the provision of low resistivity (N+/N++), arsenic or phosphorous doped single crystal silicon wafers, which, during the heat treatment cycles of essentially any electronic device manufacturing process, reliably forms oxygen precipitates, and a process for their preparation. Advantageously, this process yields wafers having greater wafer-to-wafer uniformity and, in addition, relaxes certain single crystal growth constraints required by certain prior approaches.

Briefly, therefore, the present invention is directed to a wafer sliced from a single crystal silicon ingot grown by the Czochralski method comprising a front surface, a back surface, an imaginary central plane between the front and back surfaces, a front surface layer which comprises a first region of the wafer between the front surface and a distance, D1, measured from the front surface and toward the central plane, and a bulk layer which comprises a second region of the wafer between the central plane and the first region. The wafer has a resistivity of less than 5 mΩ-cm, is doped with phosphorous or arsenic, and has a supersaturated concentration of crystal lattice vacancies in the bulk layer whereby (a) oxygen precipitates form in the bulk layer at a concentration of at least $1\times10^7$ oxygen precipitates/$cm^3$ upon subjecting the wafer to an oxygen precipitation heat-treatment at a temperature in excess of 700° C., and (b) the supersaturated concentration of crystal lattice vacancies is reduced and the formation of oxygen precipitates in the bulk layer at a concentration of at least $1\times10^7$ oxygen precipitates/$cm^3$ is avoided by (i) heating the wafer to an annealing temperature of at least 950° C. at a rate of at least 2° C./sec, and (ii) cooling the wafer from the annealing temperature to 700° C. or less before the wafer is subjected to an oxygen precipitation heat-treatment at a temperature in excess of 700° C.

The invention is further directed to a process for heat-treating a single crystal silicon wafer sliced from a single crystal silicon ingot grown by the Czochralski method to influence the precipitation behavior of oxygen in the wafer in a subsequent thermal processing step, the silicon wafer having a front surface, a back surface, a central plane between the front and back surfaces, a front surface layer which comprises the region of the wafer between the front surface and a distance, D1, measured from the front surface and toward the central plane, a bulk layer which comprises the region of the wafer between the central plane and front surface layer, is doped with arsenic or phosphorous, and has a resistivity of less than about 5 mΩ-cm. The process comprises heat-treating the single crystal silicon wafer in an atmosphere comprising a nitrogen-containing gas to increase a density of crystal lattice vacancies in the wafer bulk, and cooling the heat-treated wafer such that the wafer bulk is supersaturated with crystal lattice vacancies.

Other objects and features of this invention will be in part apparent and in part pointed out hereinafter.

BRIEF DESCRIPTION OF THE DRAWINGS

FIG. 1 is a schematic depiction of the process of the present invention.

DETAILED DESCRIPTION OF THE PREFERRED EMBODIMENTS

Single crystal silicon wafers of the present invention are N-type (N+/N++), heavily doped with arsenic or phosphorus. In addition, these wafers may contain essentially any oxygen concentration attainable by the Czochralski growth process and nevertheless reliably and reproducibly form oxygen precipitates in the wafer bulk sufficient for intrinsic gettering purposes. In addition, the oxygen precipitates will conveniently form during the heat treatment cycle of essentially any electronic device manufacturing process.

A. Starting Material

In one embodiment, the starting material for the wafer of the present invention is a silicon wafer which has been sliced from a single crystal ingot grown in accordance with conventional Czochralski ("Cz") crystal growing methods, typically having a nominal diameter of 150 mm, 200 mm, 300 mm, 400 mm, or more. The wafer may be polished or, alternatively, lapped and etched but not polished. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications.

Referring to FIG. 1, the wafer 1 preferably has a front surface 3, a back surface 5, and an imaginary central plane 7 between the front and back surfaces. The terms "front" and "back" in this context are used to distinguish the two major, generally planar surfaces of the wafer 1. The front surface 3 of the wafer 1 (as that phrase is used herein) is not necessarily the surface onto which an electronic device will subsequently be fabricated, nor is the back surface 5 of the wafer 1 (as that phrase is used herein) necessarily the major surface of the wafer 1 which is opposite the surface onto which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The wafer is doped with either arsenic or phosphorus in concentrations sufficient to impart low resistivity (N+/N++) to the wafer, i.e., less than about 5 mΩ-cm. In one embodiment, the wafer is doped with arsenic in a concentration of at least $1 \times 10^{19}$ atoms/cm$^3$. For example, the wafer may have an arsenic concentration of about $1 \times 10^{19}$ atoms/cm$^3$ to about $3 \times 10^{19}$ atoms/cm$^3$, i.e., about 200 PPMA to about 600 PPMA. Wafers doped with arsenic at these concentrations typically have resistivities of about 0.1 mΩ-cm to about 5 mΩ-cm. In one presently preferred embodiment, the wafer is doped with arsenic in a concentration of about $1.7 \times 10^{19}$ atoms/cm$^3$ to about $3 \times 10^{19}$ atoms/cm$^3$ (about 340 PPMA to about 600 PPMA); wafers doped with arsenic at these concentrations typically have resistivities of about 2.6 mΩ-cm to about 3.9 mΩ-cm. When phosphorous is used as the dopant, the wafer will typically be doped with phosphorus in a concentration of at least $1 \times 10^{19}$ atoms/cm$^3$. For example, the wafer may have a phosphorous concentration of about $1 \times 10^{19}$ atoms/cm$^3$ to about $4.5 \times 10^{19}$ atoms/cm$^3$, i.e., about 200 PPMA to about 900 PPMA. Wafers doped with phosphorous at these concentrations typically have resistivities of about 0.1 mΩ-cm to about 2 mΩ-cm. In another preferred embodiment, the wafer is doped with phosphorus in a concentration of about $4.1 \times 10^{19}$ atoms/cm$^3$ to about $4.5 \times 10^{19}$ atoms/cm$^3$ (about 820 PPMA to about 900 PPMA), which imparts resistivities of about 1.1 mΩ-cm to about 1.9 mΩ-cm.

The wafer may have an oxygen concentration falling anywhere within the range attainable by the Cz process. Low resistivity wafers, such as those heavily doped with arsenic or phosphorous, however, typically have slightly lower oxygen concentrations than undoped or lightly doped wafers. For example, wafers doped with arsenic typically have an oxygen concentration of about $4.5 \times 10^{17}$ atoms/cm$^3$ to about $5.5 \times 10^{17}$ atoms/cm$^3$, i.e., about 9 PPMA to about 11 PPMA. In one embodiment, arsenic doped wafers have an oxygen concentration of about $5.5 \times 10^{17}$ atoms/cm$^3$ to about $8 \times 10^{17}$ atoms/cm$^3$, i.e., about 11 PPMA to about 16 PPMA. Wafers doped with phosphorous typically have an oxygen concentration of about $6 \times 10^{17}$ atoms/cm$^3$ to about $9 \times 10^{17}$ atoms/cm$^3$, i.e., about 12 PPMA to about 18 PPMA. In one embodiment, phosphorous doped wafers have an oxygen concentration of about $7.5 \times 10^{17}$ atoms/cm$^3$ to about $8.5 \times 10^{17}$ atoms/cm$^3$, i.e., about 15 PPMA to about 17 PPMA.

Substitutional carbon, when present as an impurity in single crystal silicon has the ability to catalyze the formation of oxygen precipitate nucleation centers. Nevertheless, it is generally preferred that the single crystal silicon starting material have a relatively low concentration of carbon. Thus, in one embodiment it is preferred that the single crystal silicon have less than about $5 \times 10^{16}$ atoms/cm$^3$, more preferably less than about $1 \times 10^{16}$ atoms/cm$^3$, and still more preferably less than about $5 \times 10^{15}$ atoms/cm$^3$ carbon.

During the Cz growth process, conditions can ordinarily be selected to yield single crystal silicon in which the predominant intrinsic point defect is crystal lattice vacancies or silicon self-interstitial atoms. Heavily doping the silicon crystal with arsenic or phosphorous during the crystal growth process tends to make it more difficult to grow vacancy-dominated single crystal silicon. Without being bound to any particular theory, it appears arsenic and phosphorous doping increases the concentration of interstitial atoms in two respects. Arsenic and phosphorous, themselves, may exist in the silicon as a substitutional or an interstitial atom. In addition, it appears arsenic and phosphorous have the ability to trap excess silicon self-interstitials. As a result, the equilibrium appears to be shifted in the direction of interstitial atoms which tend to suppress oxygen precipitation and away from crystal lattice vacancies which tend to promote oxygen precipitation, as compared to undoped single crystal silicon grown under identical conditions.

B. Creating a Supersaturated Concentration of Vacancies

In accordance with the process of the present invention, a low resistivity arsenic or phosphorous doped wafer is subjected to a thermal anneal to inject crystal lattice vacancies into the starting wafer, and the wafer is then rapidly cooled to freeze a supersaturated concentration of crystal lattice vacancies into the wafer. Stated differently, crystal lattice vacancies are the predominant intrinsic point defect in the resulting wafers, and are present in a supersaturated concentration.

When such wafers are thereafter subjected to an oxygen precipitation heat treatment, the crystal lattice vacancies promote oxygen precipitation and, as a result, the wafers form oxygen precipitates in the wafer bulk in sufficient density for intrinsic gettering.

Referring to FIG. 1, the wafer is subjected to a heat-treatment step in which the wafer is heated to an elevated temperature to form and thereby increase the number density of crystal lattice vacancies 9 in wafer 1. Preferably, this heat-treatment step is carried out in a rapid thermal annealer in which the wafer is rapidly heated to a target temperature and annealed at that temperature for a relatively short period of time. Typically, the wafers will be heated to the annealing temperature at a heating rate of at least about 10° C./sec, more preferably several tens of degrees centigrade per second (i.e., at least about 20° C./sec, 30° C./sec, 40° C./sec, 50° C./sec, 60° C./sec, or more), and more typically at a heating rate of at least 100° C./sec. In general, the annealing temperature is in excess of 1200° C., preferably at least about 1230° C., more preferably at least about 1250° C., and most preferably between about 1250° C. and 1300° C.

In general, the number of crystal lattice vacancies injected during the rapid thermal annealing step is primarily a function of the annealing temperature, the composition of the atmosphere in which the annealing step is carried out, and the length of time the wafers are annealed. In general, the equilibrium concentration of crystal lattice vacancies tends to increase as a function of increasing temperature. Thus, greater process temperatures tend to increase the concentration of crystal lattice vacancies injected into the wafer during the rapid thermal annealing step. In general, oxidizing atmospheres tend to favor the formation of silicon self-interstitials as compared to neutral atmospheres, (i.e, non-oxidizing, non-nitriding atmospheres) whereas nitriding atmospheres tend to favor the formation of crystal lattice vacancies as compared to neutral atmospheres. And, because nitriding atmospheres promote the formation of crystal lattice vacancies, the concentration of crystal lattice vacancies in the wafer increases as a function of annealing time in a nitriding atmosphere.

In general, an atmosphere is selected for the rapid thermal annealing step which yields a wafer having crystal lattice vacancies as the predominant intrinsic point defect and which, after cooling, is supersaturated in crystal lattice vacancies. Thus, for example, the atmosphere may contain a mixture of oxidizing gases (e.g., oxygen or water-vapor), neutral gases (e.g., helium, argon) or nitriding gases (e.g., nitrogen or a nitrogen-containing compound gas such as ammonia). Preferably, the atmosphere is nitriding, with a substantial absence of oxidizing and neutral gases. That is, the atmosphere preferably comprises a nitriding gas, such as nitrogen or ammonia.

An increase in vacancy concentration throughout the wafer is achieved nearly, if not immediately, upon achieving the annealing temperature. Continued annealing of the wafer at this temperature in an overall nitriding atmosphere will further increase the vacancy concentration. Typically, the wafer will be maintained at this temperature for at least one second, typically for at least several seconds (e.g., at least 3) or even several tens of seconds of seconds. In one embodiment, the wafer is maintained at this temperature for at least 10 seconds, preferably at least 15 seconds. The wafer may be annealed for up to about 60 seconds (which is near the limit for commercially available rapid thermal annealers). In any event, the wafer is annealed in the selected ambient and at an annealing temperature for a period sufficient for crystal lattice vacancies to be the predominant intrinsic point defect in the wafer bulk, thereby overcoming any influence the arsenic or phosphorous dopant may have exerted upon the relative concentrations of intrinsic point defects in the silicon crystal when the single crystal was grown. Thought of mathematically, the process yields a sum of injected vacancies and vacancies present because of the Cz growth conditions which is greater than the sum of silicon self-interstitials and dopant interstitials i.e., $[\text{vacancies}]_{inj}+[\text{vacancies}]_{Cz}>[\text{interstitials}]_{Si}+[\text{interstitials}]_{dopant}$. For shorter annealing periods, only the near surface regions become vacancy dominant (if the silicon had silicon self-interstitials as the predominant intrinsic point defect in the as-grown state). For longer annealing periods, the entire thickness of the wafer may become vacancy dominant.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1250° C. in a few seconds. One such commercially available RTA furnace is the 3000 RTP furnace, available from Mattson Technology Inc (47131 Bayside Parkway, Freemont, Calif. 94538).

Crystal lattice vacancies, like metals and other elements, are capable of diffusing through single crystal silicon with the rate of diffusion being temperature dependent. For example, crystal lattice vacancies are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the diffusion rate of vacancies slows considerably at temperatures less than about 700° C. and perhaps as great as 800° C., 900° C., or even 1000° C., the vacancies can be considered to be immobile for any commercially practical time period.

Upon completion of the rapid thermal anneal, the wafer is rapidly cooled through the range of temperatures at which crystal lattice vacancies are relatively mobile in the single crystal silicon. Referring again to FIG. 1, as the temperature of the wafer 1 is decreased through this range of temperatures, vacancies diffuse to the surface layers 3, 5 and become annihilated, thus leading to a change in the vacancy concentration with the extent of change depending upon the length of time the wafer is maintained at a temperature within this range. If the wafer were held at this temperature within this range for an infinite period of time, the vacancy concentration would once again become substantially uniform throughout the wafer bulk 11 with the concentration being an equilibrium value which is substantially less than the concentration of crystal lattice vacancies immediately upon completion of the heat treatment step. To avoid this result, the wafer is rapidly cooled to freeze a supersaturated density of crystal lattice vacancies within the wafer bulk. In general, the average cooling rate within this range of temperatures is at least about 5° C. per second, preferably at least about 20° C. per second, more preferably at least about 50° C. per second, still more preferably at least about 100° C. per second, with cooling rates in the range of about 100° C. to about 200° C. per second being presently most preferred. Because infinitely rapid cooling is unachievable, at least some vacancies will diffuse out of the wafer at the surface layer. The lower density of vacancies after rapid cooling in comparison to the density achieved at the end of the rapid thermal anneal is not critical provided that cooling is rapid enough to freeze a supersaturated concentration of vacancies throughout the wafer bulk such that the wafer, either in the near surface regions or throughout the bulk, is vacancy dominant. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical.

In general, the rapid cooling step may be carried out in any of the atmospheres previously noted for the annealing step. In the interests of convenience and simplicity, however, it is generally preferred that the annealing and cooling steps be carried out in the same or, at least substantially the same, atmosphere.

As a result of the rapid thermal annealing and cooling steps, a supersaturated concentration of crystal lattice vacancies are frozen into a heavily doped wafer. Although this supersaturated vacancy concentration cannot be readily measured directly, its existence can be indirectly established by the alternative use of (i) an oxygen precipitation heat-treatment at a temperature in excess of about 700° C. (e.g., annealing the wafer for 4-8 hours at 800° C. and then 16 hours at 1000° C.) or (ii) an oxygen precipitation nucleii dissolution heat-treatment (e.g., 15 minutes at 1000° C.). In an oxygen precipitation heat-treatment, the supersaturated vacancies promote the formation of oxygen precipitates and the resulting wafer will have a concentration of oxygen precipitates of at least about $1 \times 10^7$ oxygen precipitates/cm$^3$. If the wafers are subjected to an oxygen precipitate nucleii dissolution heat-treatment before they are subjected to an oxygen precipitation heat-treatment, however, the dissolution heat-treatment will reduce the concentration of crystal lattice vacancies in the wafer below the threshold at which precipitation is promoted. For example, the oxygen precipitate nucleii dissolution heat-treatment can comprise the steps of (i) heating the wafer to an annealing temperature of at least 950° C. at a rate of at least 2° C./sec, and (ii) cooling the wafer from the annealing temperature to 700° C. or less before the wafer is subjected to an oxygen precipitation heat-treatment at a temperature in excess of 700° C. As a result, wafers subjected to an oxygen precipitate nucleii dissolution heat-treatment before an oxygen precipitation heat-treatment will not form oxygen precipitates in a concentration of at least $1 \times 10^7$ oxygen precipitates/cm$^3$ whereas wafers subjected an oxygen precipitation heat-treatment (without being subjected to an oxygen precipitate nucleii dissolution step post rapid thermal annealing and cooling and pre oxygen precipitation heat treatment) will form oxygen precipitates in a concentration of at least $1 \times 10^7$ oxygen precipitates/cm$^3$, typically about $1 \times 10^7$ oxygen precipitates/cm$^3$ to about $1 \times 10^{10}$ oxygen precipitates/cm$^3$, preferably about $1 \times 10^8$ oxygen precipitates/cm$^3$ to about $1 \times 10^{10}$ oxygen precipitates/cm$^3$, even more preferably about $1 \times 10^9$ oxygen precipitates/cm$^3$ to about $1 \times 10^{10}$ oxygen precipitates/cm$^3$.

The concentration profile of crystal lattice vacancies in wafers of the present invention is, in part, a function of the cooling rate from the annealing temperature to a temperature at which crystal lattice vacancies are relatively immobile. As previously noted, the rate of cooling from the annealing temperature can have a pronounced effect upon crystal lattice vacancy concentration. Because wafers cannot be cooled infinitely fast, some crystal lattice vacancies will inevitably diffuse to the silicon surface and escape before they become frozen into the wafer. As a result, the wafer may possess a near-surface region (the region between the surface and a distance D1 measured from the surface as shown in FIG. 1) and a wafer bulk (the region extending from the imaginary central plane to the near-surface region in FIG. 1) which differ in oxygen precipitation behavior. That is, oxygen precipitates form in the bulk at a concentration of at least about $1 \times 10^7$ oxygen precipitates/cm$^3$ during an oxygen precipitation heat-treatment, but in the near-surface region, the concentration of oxygen precipitates is less than $1 \times 10^7$ oxygen precipitates/cm$^3$ during an oxygen precipitation heat-treatment. In general, the depth of the near surface region increases with decreasing cooling rates; typically, the depth of the near-surface region will be at least 3 microns, more typically at least 5 microns, and it may even exceed 10 microns. Preferably, the near-surface region will have a depth of about 3 to about 5 microns, more preferably about 5 to about 10 microns.

The concentration profile of crystal lattice vacancies in wafers of the present invention is also a function of the atmosphere employed for the rapid thermal annealing step. When nitriding atmospheres are used during the annealing step, the concentration of crystal lattice vacancies tends to decrease as a function of depth from the wafer surface (i.e., the bulk layer comprises a non-uniform concentration of crystal lattice vacancies whereby the maximum concentration is at or near the wafer surface and the concentration generally decreases in the direction of the imaginary central plane, whereby the minimum concentration is at or near the imaginary central plane). When such wafers are rapidly cooled, some vacancies in the near-surface region have time to escape the system, thus creating a profile in which the maximum vacancy concentration is somewhere intermediate of the imaginary central plane and the wafer surface (i.e., it has an "M"-shaped profile, whereby the concentration of crystal lattice vacancies generally decreases in the direction of both the front surface layer and the central plane) with the position of maximum density being at a distance from the wafer surface which increases with decreasing cooling rate; in such instances, the maximum concentration will occur at a depth of about 20 to about 70 microns from the wafer surface.

C. Post-Processing of Wafers

Silicon wafers of the present invention may be used in a variety of applications. For example, such wafers having a bare silicon surface polished to a specular finish (i.e., a polished wafer) may be used directly in an integrated circuit manufacturing process. Alternatively, the wafer may be used as a substrate for homoepitaxial deposition or SOI (by layer transfer or oxygen implantation).

1. Etching

As noted above, the rapid thermal heating and cooling steps of the present invention will generally lead to the formation of a wafer having regions which behave differently in an oxygen precipitation heat-treatment: in a near-surface region oxygen precipitates will generally not form whereas they will form in the wafer bulk. If desired, this near-surface region may be removed by chemical etching (e.g., etching in a caustic or acid etchant) to produce a wafer which will, in an oxidation precipitation heat-treatment, form oxygen precipitates from front surface to back surface. If desired, the near-surface region may be substantially, but not entirely, removed by chemical etching to product a wafer which will, in an oxidation precipitation heat-treatment, form oxygen precipitates in a bulk region extending from a front surface layer having a depth, D1, of less than 2 μm.

2. Polishing

If the wafer used in the rapid thermal annealing step was not polished to a specular finish in advance, the wafer may be chemically or chemomechanically polished to a specular finish after the rapid thermal annealing and cooling steps. Again, if desired, the near-surface region may be removed in such a polishing step to produce a wafer which will, in an oxidation precipitation heat-treatment, form oxygen precipitates from front surface to back surface.

3. Epitaxial Layer

The wafer may be prepared for epitaxial layer deposition. If an epitaxial layer is to be deposited on the wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The epitaxial layer may be deposited onto the entire wafer, or, alternatively, onto only a portion of the wafer. Referring to FIG. 1, the epitaxial layer 13 preferably is deposited onto the front surface 3 of the wafer. More preferably, it is deposited onto the entire front surface 3 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

The wafer surfaces may comprise an oxide or nitride layer. For example, a silicon oxide layer forms on a silicon surface when it is exposed to air at room temperature and generally has a thickness of from about 10 to about 15 Å. A silicon nitride layer may result from rapid thermal anneal in a nitriding atmosphere. The wafer may have a surface layer comprising oxide and nitride in mixed stoichiometry (referred to as a "nitride/oxide layer" hereinafter). Preferably, the nitride, oxide, or nitride/oxide layer is removed from the surface of the wafer before the epitaxial layer is deposited onto the surface.

Removal of a silicon oxide or nitride/oxide layer may be accomplished by heating the surface of the wafer in an oxidant-free atmosphere until the oxide or nitride/oxide layer is removed from the surface. For example, the surface of the wafer is preferably heated to a temperature of at least about 1100° C., and more preferably to a temperature of at least about 1150° C. This heating preferably is conducted while exposing the surface of the wafer to an atmosphere comprising $H_2$ or a noble gas (e.g., He, Ne, or Ar). More preferably, the atmosphere comprises $H_2$. Most preferably, the atmosphere consists essentially of $H_2$ because use of other atmospheres tends to cause etch pits to form in the surface of the wafer.

Generally, it is preferable to heat the wafer surface to remove the silicon oxide or nitride/oxide layer and then initiate silicon deposition less than 30 seconds (more preferably within about 10 seconds) after the oxide or nitride/oxide is removed. Generally, this may be accomplished by heating the wafer surface to a temperature of at least about 1100° C. (more preferably at least about 1150° C.) and then initiating the silicon deposition less than 30 seconds (more preferably within about 10 seconds) after the wafer surface reaches that temperature. Waiting to initiate silicon deposition for up to about 10 seconds after removal of the silicon oxide or nitride/oxide layer allows the temperature of the wafer to stabilize and become uniform.

Alternatively, the oxide or nitride/oxide layer may be chemically stripped. In embodiments where the silicon surface has a nitride/oxide layer, chemical stripping is the preferred means for removing the nitride/oxide layer. Chemical stripping may be done by means known in the art using phosphoric acid, hydrofluoric acid, or other acids as are known. In another alternative, the oxide or nitride/oxide layer may be etched by plasma etching, using, for example, eMAX from Applied Materials, or other methods as are known in the art.

In embodiments where the surface layer is predominantly a silicon nitride layer, the nitride layer may be removed by polishing, chemical etching, or plasma etching (such as eMAX from Applied Materials, or other etching methods as are known in the art).

The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature. If the epitaxial layer is deposited after the rapid thermal anneal of the present invention, a steep temperature ramp may dissolve crystal lattice vacancies. The wafer may then become interstitial dominant, which could inhibit oxygen precipitate formation and growth during an oxygen precipitation heat treatment. This result is avoided by choosing a relatively flat temperature ramp or a stepped ramp such that the crystal lattice vacancies may equilibrate to the higher temperatures. Advantageously, a relatively flat temperature ramp also stabilizes oxygen precipitate nucleii in the wafer bulk.

The rate of growth of the epitaxial deposition preferably is from about 0.5 to about 7.0 μm/min. A rate of about 3.5 to about 4.0 μm/min may be achieved, for example, by using an atmosphere consisting essentially of about 2.5 mole % $SiHCl_3$ and about 97.5 mole % $H_2$ at a temperature of about 1150° C. and an absolute pressure of up to about 1 atm.

In some applications, the wafers comprise an epitaxial layer which imparts electrical properties. In homoepitaxial layer deposition, the epitaxial layer is lightly doped with phosphorous. Therefore, the ambient for epitaxial deposition comprises phosphorous present as a volatile compound, such as, for example, phosphine, $PH_3$. Alternatively, the homoepitaxial layer can contain boron. Such a layer may be prepared by, for example, including $B_2H_6$ in the atmosphere during the deposition.

Epitaxial deposition typically requires a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. The epitaxial wafers of the present invention may be cleaned by methods known in the art.

4. Silicon on Insulator (SOI)

A silicon on insulator structure generally comprises a device layer, a handle wafer or supporting layer, and an insulating film or layer (typically an oxide layer) between the supporting layer and the device layer. Generally, the device layer is between about 0.5 and 20 micrometers thick. Silicon on insulator structures may be prepared using various techniques known in the art, such as SIMOX or BESOI.

SOI structures may be prepared, for example, by the SIMOX process by subjecting the wafer to an ion implantation process which is standard in the art. (See, e.g., U.S. Pat. No. 5,436,175 and *Plasma Immersion Ion Implantation for Semiconductor Processing*, Materials Chemistry and Physics 46 (1996) 132-139, both of which are incorporated herein by reference).

SOI structures may also be prepared by bonding two wafers and removing a portion of one of the bonded wafers. For example, SOI structures can be prepared by the BESOI process, wherein the wafer is bonded to another wafer, and then a substantial portion of one of the wafers is etched away using known wafer thinning techniques to obtain the device layer. (See, e.g., U.S. Pat. Nos. 5,024,723 and 5,189,500 which are incorporated herein by reference.) The following example will illustrate the invention.

EXAMPLE

Red phosphorus doped silicon single crystals were pulled by the Czochralski method, sliced and polished to form silicon wafers. The initial oxygen concentration of each wafer was from about 12 PPMA to about 18 PPMA, and the resistivity was from about 1.2 mΩ-cm to about 1.7 mΩ-cm. The wafers were then subjected to rapid thermal annealing in nitrogen, rapidly cooled, and subjected to oxygen precipitate stabilization and growth. The temperature of the rapid thermal anneal was varied as shown in TABLE I, but all samples were annealed for 15 seconds. The samples were cooled at 60° C./sec. Oxygen precipitate formation and stabilization occurred at 800° C. temperature for 4 hours, followed by 1000° C. for 16 hours. The average concentration and peak concentration of oxygen precipitates were measured at the center, at half the radius, and at the edge of each wafer. It was observed that for all samples the peak concentration occurred near the wafer surface. The results are depicted in TABLE I.

TABLE I

BMD Concentration in Heavily Phosphorus Doped Wafers

| Sampling Position | Ambient: $N_2$ Temperature (° C.) | | | BMD ($\times 10^7/cm^3$) | | | Peak BMD ($\times 10^7/cm^3$) | | |
|---|---|---|---|---|---|---|---|---|---|
| | 1200 | 1230 | 1250 | Center | R/2 | Edge | Center | R/2 | Edge |
| Seed | — | AVAB | — | 237 | 182 | 153 | 399 | 359 | 367 |
| Center | AVE50 | — | — | 37.4 | 34.1 | 29.2 | — | — | — |
| | AWC34 | — | — | 9.40 | 9.05 | 4.00 | — | — | — |
| | — | AWC55 | — | 45.9 | 34.9 | 23.9 | 147 | 123 | 111 |
| | — | — | AVE49 | 94.0 | 99.0 | 140 | 154 | 147 | 157 |
| | — | — | AVE44 | 43.9 | 31.3 | 43.9 | 887 | 872 | 903 |
| Tail | AWF1D | — | — | 21.8 | 13.6 | 2.95 | — | — | — |
| | AWF1E | — | — | 41.4 | 11.8 | 7.04 | — | — | — |
| | — | AVG13 | — | 2.57 | 2.32 | 2.24 | 49.1 | 54 | 44.2 |
| | — | AWF20 | — | 4.56 | 4.81 | 3.40 | 79.8 | 79 | 71.8 |
| | — | — | AWF27 | 38.9 | 22.6 | 8.77 | 98.3 | 123 | 98.3 |
| | — | — | AWF1C | 26.3 | 27.6 | 46.4 | 133 | 172 | 155 |

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A process for heat-treating a single crystal silicon wafer sliced from a single crystal silicon ingot grown by the Czochralski method to influence the precipitation behavior of oxygen in the single crystal silicon wafer in a subsequent thermal processing step, the single crystal silicon wafer having a front surface, a back surface, a central plane between the front and back surfaces, a front surface layer which comprises the region of a wafer between the front surface and a depth, D1, measured from the front surface and toward the central plane, a bulk layer which comprises the region of the wafer between the central plane and front surface layer, is doped with arsenic or phosphorous, and has a resistivity of less than about 5 mΩ-cm, the process comprising:
   heat-treating the single crystal silicon wafer in an atmosphere comprising a nitrogen-containing gas to increase a density of crystal lattice vacancies in the wafer bulk; and
   cooling the heat-treated single crystal silicon wafer such that the wafer bulk is supersaturated with crystal lattice vacancies.

2. The process for heat-treating a single crystal silicon wafer according to claim 1 wherein subjecting the cooled wafer to an oxygen precipitation heat-treatment at a temperature in excess of about 700° C. causes the formation of oxygen precipitates in the bulk layer.

3. The process for heat-treating a single crystal silicon wafer according to claim 2 wherein the oxygen precipitation heat-treatment step causes the formation of oxygen precipitates at a density of at least about $1\times10^7$ cm$^{-3}$.

4. The process for heat-treating a single crystal silicon wafer according to claim 2 wherein the oxygen precipitation heat-treatment step causes the formation of oxygen precipitates at a density of at least about $1\times10^8$ cm$^{-3}$.

5. The process for heat-treating a single crystal silicon wafer according to claim 2 wherein the oxygen precipitation heat-treatment step causes the formation of oxygen precipitates at a density of at least about $1\times10^9$ cm$^{-3}$.

6. The process for heat-treating a single crystal silicon wafer according to claim 1 wherein the atmosphere comprising the nitrogen-containing gas comprises nitrogen or ammonia.

7. The process for heat-treating a single crystal silicon wafer according to claim 1 wherein heat-treating the single crystal silicon wafer comprises heating the wafer to a temperature of at least about 1200° C. at a heating rate of at least about 10° C/sec and maintaining the wafer at that temperature for a period of at least about 1 second and less than about 60 seconds.

8. The process for heat-treating a single crystal silicon wafer according to claim 7 wherein the heating rate is at least about 60° C/sec.

9. The process for heat-treating a single crystal silicon wafer according to claim 1 wherein heat-treating the single crystal silicon wafer comprises heating the wafer to a temperature of at least about 1230° C. at a heating rate of at least about 10° C/sec and maintaining the wafer at that temperature for a period of at least about 1 second and less than about 60 seconds.

10. The process for heat-treating a single crystal silicon wafer according to claim 9 wherein the heating rate is at least about 60° C/sec.

11. The process for heat-treating a single crystal silicon wafer according to claim 1 wherein heat-treating the single crystal silicon wafer comprises heating the wafer to a temperature of at least about 1230° C. at a heating rate of at least about 10° C/sec and maintaining the wafer at that temperature for a period of about 15 seconds.

12. The process for heat-treating a single crystal silicon wafer according to claim 11 wherein the heating rate is at least about 60° C/sec.

13. The process for heat-treating a single crystal silicon wafer according to claim 1 wherein the heat-treated wafer is cooled at a rate of at least about 20° C/second through the temperature range in which crystal lattice vacancies are relatively mobile in silicon.

14. The process for heat-treating a single crystal silicon wafer according to claim 1 wherein the heat-treated wafer is cooled at a rate of at least about 50° C/second through the temperature range in which crystal lattice vacancies are relatively mobile in silicon.

15. The process for heat-treating a single crystal silicon wafer according to claim 1 wherein the heat-treated wafer is cooled at a rate of at least about 100° C/second through the temperature range in which crystal lattice vacancies are relatively mobile in silicon.

16. The process for heat-treating a single crystal silicon wafer according to claim 1 wherein the wafer is a substrate for epitaxy and the process further comprises the step of depositing an epitaxial layer on the front surface of the wafer.

17. The process for heat-treating a single crystal silicon wafer according to claim 16 wherein the epitaxial layer is deposited after the heat-treating step.

18. The process for heat-treating a single crystal silicon wafer according to claim 16 wherein the depositing an epitaxial layer comprises the step of:

exposing the wafer to an atmosphere comprising $SiHCl_3$, $H_2$, and $PH_3$.

* * * * *